(12) United States Patent
Dautartas et al.

(10) Patent No.: US 6,514,791 B2
(45) Date of Patent: Feb. 4, 2003

(54) METHOD FOR FABRICATING THERMOELECTRIC COOLERS AND SEMICONDUCTOR DEVICES FORMED THEREFROM

(75) Inventors: Mindaugas F. Dautartas, Blacksburg, VA (US); Joseph M. Freund, Fogelsville, PA (US); George J. Przybylek, Douglasville, PA (US)

(73) Assignee: Agere Systems Inc., Miami Lakes, FL (US)

( * ) Notice: Subject to any disclaimer, the term of this patent is extended or adjusted under 35 U.S.C. 154(b) by 0 days.

(21) Appl. No.: 09/790,526

(22) Filed: Feb. 23, 2001

(65) Prior Publication Data

US 2002/0119593 A1 Aug. 29, 2002

(51) Int. Cl.[7] .......................... H01L 21/44; H01L 21/00
(52) U.S. Cl. ........................... 438/106; 438/55; 438/122
(58) Field of Search ..................... 438/54, 55, 106, 438/118, 122, 127

(56) References Cited

U.S. PATENT DOCUMENTS

| | | | | |
|---|---|---|---|---|
| 5,209,786 A | * | 5/1993 | Rolfe et al. | 136/211 |
| 6,329,217 B1 | * | 12/2001 | Watanabe et al. | 438/48 |
| 6,338,251 B1 | * | 1/2002 | Ghosal | 62/3.2 |

* cited by examiner

Primary Examiner—Michael Sherry
Assistant Examiner—Scott B. Geyer
(74) Attorney, Agent, or Firm—Dickstein Shapiro Morin & Oshinsky LLP

(57) ABSTRACT

A system and method for fabricating a thermoelectric cooling (TEC) device and a semiconductor device using such a TEC device are described. Adhesive-containing support structures are used to secure, respectively, positively-doped and negatively-doped TEC elements. The elements are intermeshed and an encapsulating material is applied to the intermeshed array. The support structures are then released and the ends of the encapsulated elements are smoothed and electrically coupled together. If desired, panels are secured to the ends of the elements and a heat sink may also be provided. The TEC device may be used to control and/or tune a laser device.

11 Claims, 4 Drawing Sheets

METHOD FOR FABRICATING THERMOELECTRIC COOLERS AND SEMICONDUCTOR DEVICES FORMED THEREFROM

FIELD OF THE INVENTION

The invention relates generally to the fabrication of semiconductor devices that include fragile elements. More particularly, the invention is related to a system and a method for smoothing the ends of fragile elements used in heat transfer devices and the semiconductor devices incorporating such heat transfer devices.

BACKGROUND

Known thermoelectric coolers (TECs) for optoelectric semiconductor devices utilize fragile elements formed of bismuth telluride. Bismuth telluride, and other such materials, are susceptible to shear and/or fracture if subjected to physical stress, especially when not properly anchored. In a known method, positively- and negatively-doped elements are restrained by some mechanical means, and then the ends of the elements are smoothed or lapped to the desired size. A disadvantage of the known method is that the doped elements are susceptible to shear and/or fracture during the lapping (smoothing) process. The elements can break, chip or spall.

SUMMARY

The invention relates to an improved method of making a heat transfer device. The heat transfer device may be formed of a plurality of positively-doped and negatively-doped fragile elements. In a preferred embodiment of the invention, the ends of the elements are smoothed to a precise tolerance. The positively-doped elements may be electrically coupled to the negatively-doped elements, and an encapsulating material may be provided to hold the elements in place during the smoothing process.

The invention also relates to a system for aligning elements of a thermoelectric cooler device. The system includes a first support structure adapted to support a plurality of first elements, a second support structure adapted to support a plurality of second elements, a holding structure for positioning the first elements on the first support structure, and a source of encapsulating material for encapsulating the elements.

According to an aspect of the invention, a holding structure is used to hold the positively-doped elements and another holding structure is used to hold the negatively-doped elements. Adhesive support structures may be used to support the elements while they are intermeshed, and the elements are encapsulated in a resin or other flowable material after they are intermeshed. The hardened encapsulant material may be used to hold the intermeshed elements in place while their ends are polished or otherwise mechanically finished.

The invention also provides a method for fabricating a semiconductor device. The method includes the steps of positioning first elements on a first support structure and second elements on a second support structure, intermeshing the first and second elements such that each element contacts each support structure, and subsequently encapsulating the elements within an encapsulating material.

These and other advantages and features of the invention will be more readily understood from the following detailed description of the invention which is provided in connection with the accompanying drawings.

DETAILED DESCRIPTION OF PREFERRED EMBODIMENTS

Figure 6:
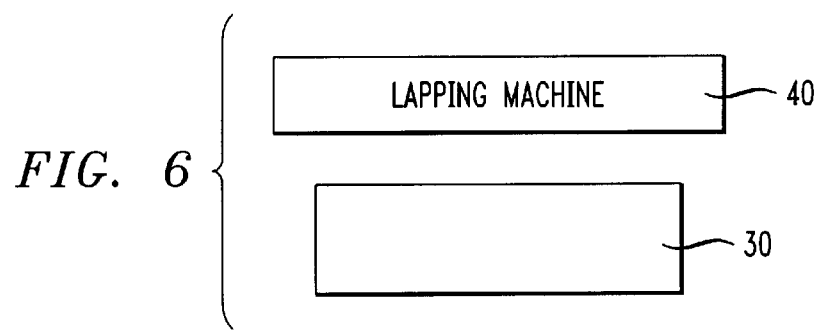
FIG. 6 is a side view illustrating the smoothing of the elements of FIG. 4.
Figure 7:
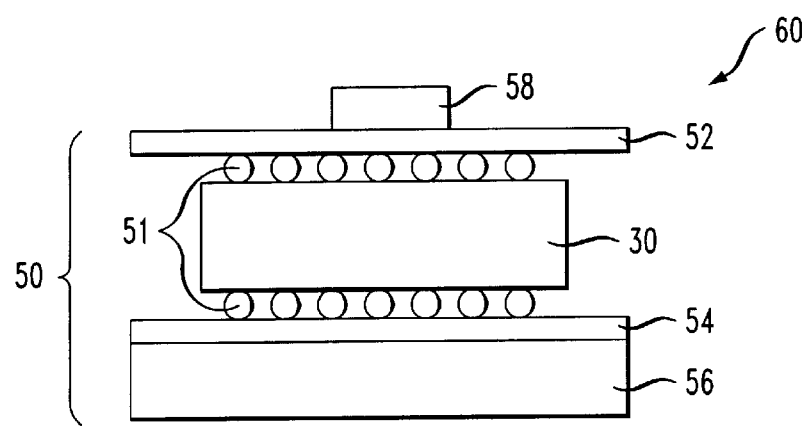
FIG. 7 is a side view of a semiconductor device constructed in accordance with an embodiment of the invention.
Figure 8:
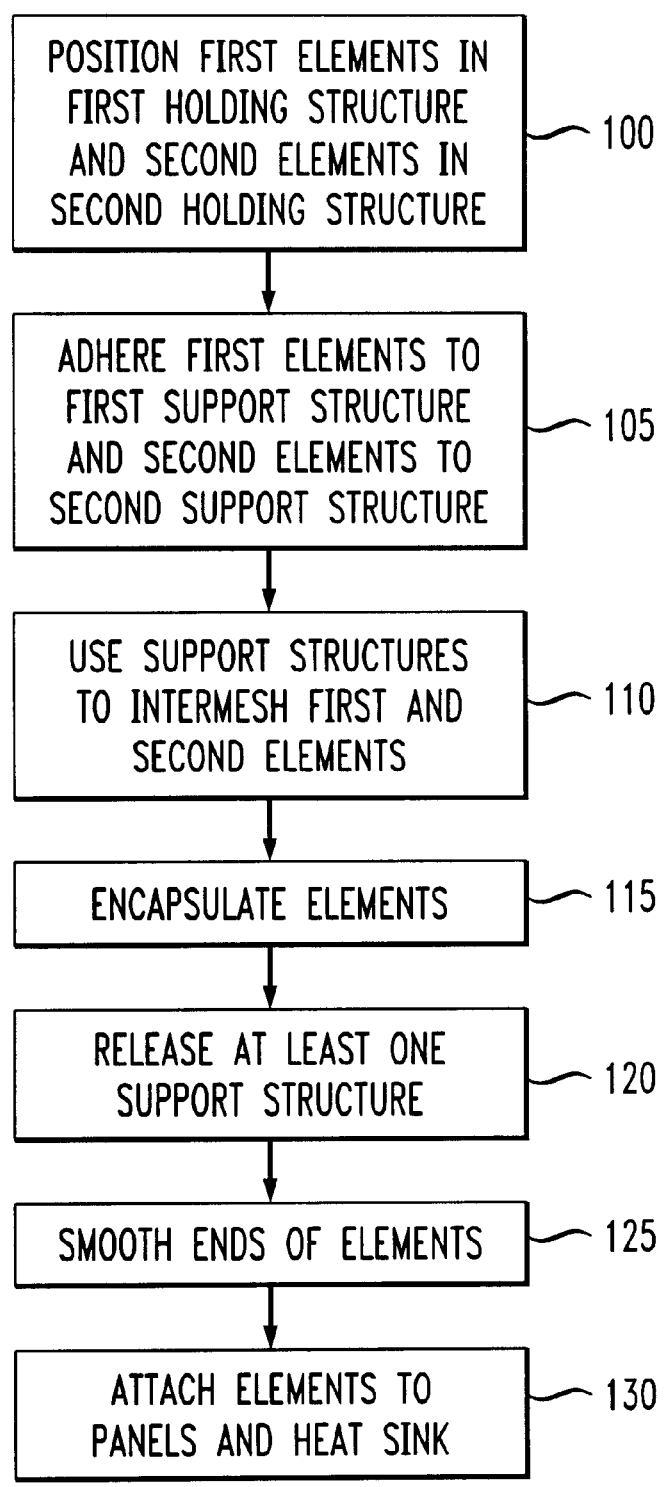
FIG. 8 illustrates process steps for fabricating a semiconductor heat transfer device in accordance with an embodiment of the invention.

FIGS. 1–8 illustrate various stages of fabricating a heat transfer device according to an exemplary embodiment of the invention. A plurality of positively-doped elements 10 are placed within respective openings 18 of a holding structure, such as a jig 16, in step 100 (FIG. 8). The jig 16 should be suitable to mechanically maintain the correct positional relationship between a piece of work, here the element 10, and the jig 16 and/or the correct positional relationship between the elements 10. The elements 10 are used in heat transfer devices, such as a thermoelectric cooler device 50 (FIG. 7), used in semiconductor packages.

Figure 1:
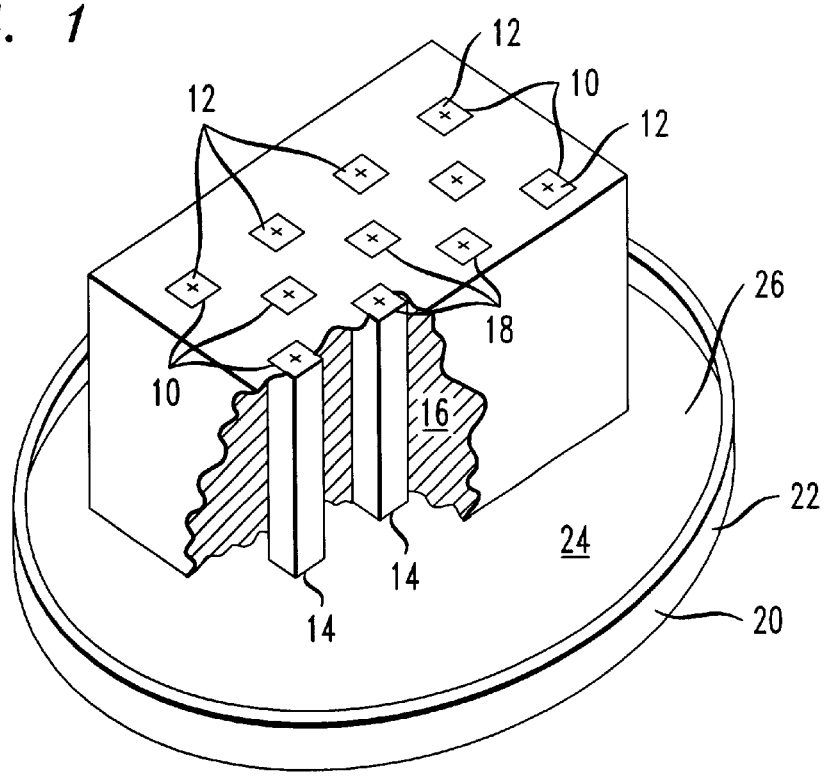
FIG. 1 is a partially broken-away perspective view illustrating the placement of positively-doped heat transfer device elements on a hoop in accordance with an embodiment of the invention.

Each element 10 has opposite ends 12, 14. As shown in FIG. 1, the first ends 12 do not abut any other object. The second ends 14 contact an adhesive surface 26 of an adhesive material 24 at step 105 (FIG. 8). The material 24, which is preferably a tape, is affixed to a hoop frame 22. The frame 22 and the material 24 make up a first hoop 20.

Figure 2:
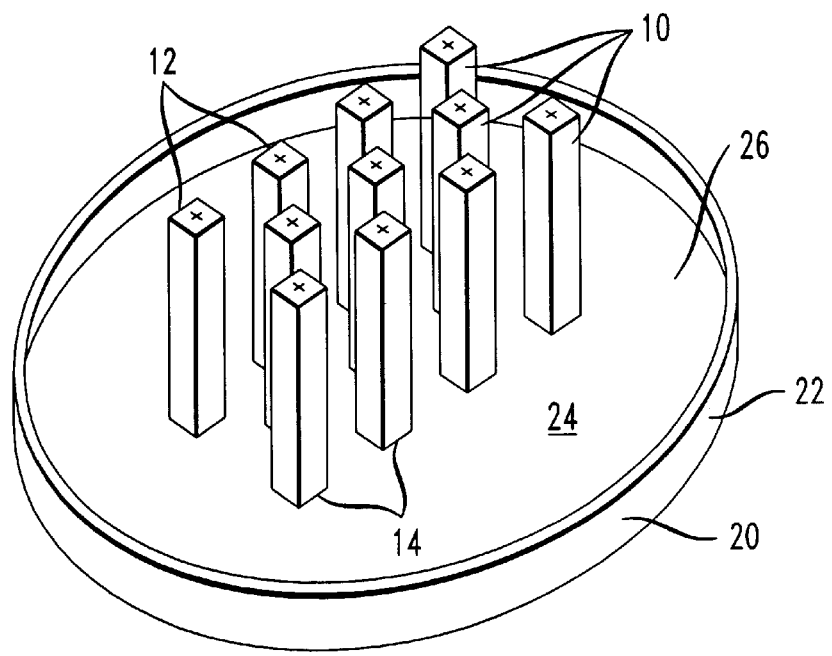
FIG. 2 is another perspective view like FIG. 1 showing the positively-doped elements adhered to the hoop.

The positively-doped elements 10 may be placed in the jig 16 (step 100) before the elements 10 are brought into contact with the adhesive surface 26 (step 105). Alternatively, the elements 10 may be located within the openings 18 after the jig 16 is brought into contact with the adhesive surface 26. After the elements 10 are adhered to the hoop 20 (step 105), the jig 16 is removed, leaving the elements 10 free-standing on the adhesive surface 26 (FIG. 2). The adhesive surface 26 contains sufficient adhesive properties to securely hold, and to inhibit tipping of, the elements 10. The adhesive material 24 may be temperature sensitive. Specifically, with the application of heat to a certain predetermined temperature the adhesive properties of the adhesive surface 26 diminish, allowing a loss of adhesion between the elements 10 and the hoop 20.

A similar operation may be undertaken to adhere negatively-doped elements 11 to an adhesive surface 26'. Specifically, a holding structure, like the jig 16, is used to collect a plurality of the elements 11 (step 100). The elements 11 have opposite ends 13, 15. An adhesive material 24' is lowered onto the jig with the elements 11 such that the adhesive surface 26' contacts the ends 15 (step 105). The adhesive material 24' is affixed to a hoop frame 22', with the frame 22' and the material 24' making up a second hoop 20'.

Figure 3:
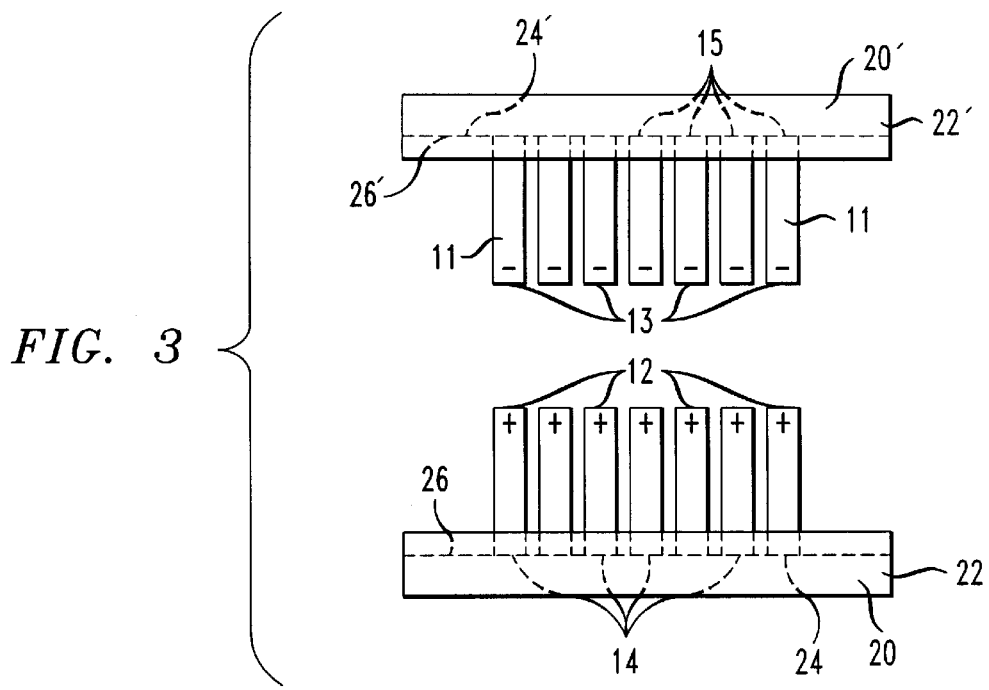
FIG. 3 is a side view illustrating intermeshing of positively-doped and negatively-doped elements in accordance with an embodiment of the invention.
Figure 4:
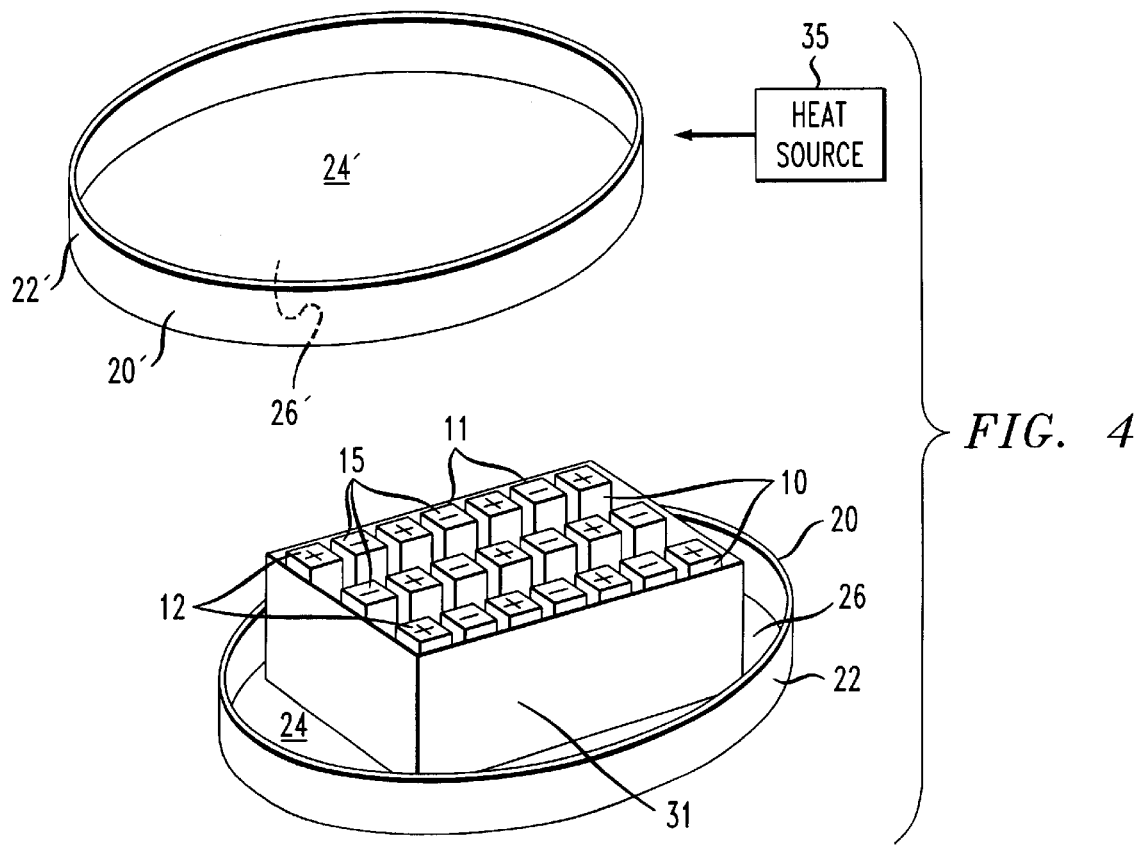
FIG. 4 is a perspective view like FIG. 2 showing intermeshed positively-doped and negatively-doped elements on the hoop.

As shown in FIG. 3, the hoop 20' is lowered and/or the hoop 20 is elevated to interdigitate or intermesh the elements 10 and 11 at step 110 (FIG. 8). Specifically, the hoops 20, 20' are placed near enough to each other to allow each of the ends 12–15 to contact one of the adhesive surfaces 26, 26'. The flexibility of the materials 24, 24' may be advantageous in ensuring that all of the element ends 12–15 are adhered to the surfaces 26, 26'. Further, the flexibility of the materials 24, 24' may be advantageous during intermeshing to allow any needed slight angular re-alignments of the elements 10, 11 to avoid breakage or damage.

Figure 5:
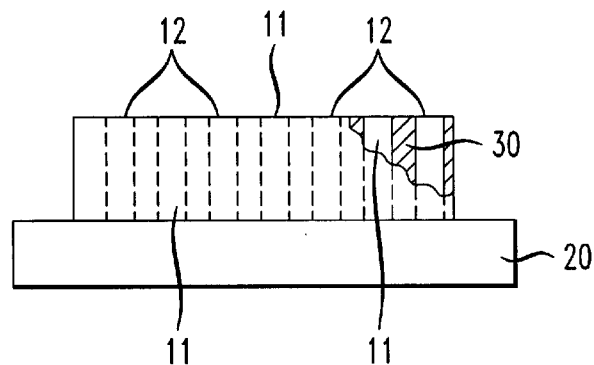
FIG. 5 is a partially broken-away side view showing the elements of FIG. 4 encased in a matrix in accordance with an embodiment of the invention.

At step 115 (FIG. 8), an encapsulating material 30 may be flowed onto and around the elements 10, 11 (FIG. 5). Alternatively, one of the hoops 20, 20' may be removed at step 120 (FIG. 8) and then the encapsulating material 30 may be flowed around and between the elements 10, 11 (step 115). A mold 31 (FIG. 4) may be utilized to assist the encapsulating material 30 to surround the elements 10, 11. The encapsulating material 30 is preferably a viscous fluid that hardens over a short period of time, either with no outside stimulus or with a temperature change. Most preferably, the material 30 is a dielectric material such as epoxy or an elastomer such as rubber. Upon hardening, the encapsulating material 30 creates a solid matrix around the elements 10, 11 which prevents tipping.

Utilizing the temperature sensitivity of the adhesive material 24', heat from a heat source 35 (FIG. 4) is directed at the adhesive surface 26' to release the hoop 20' from the ends 12, 15 at step 120 (FIG. 8). As an alternative, it is equally possible to heat the adhesive surface 26 to release the hoop 20 and leave the elements 10, 11 adhered to the hoop 20'.

After the material 30 has hardened, the remaining hoop 20 can be released in the same manner as the hoop 20' (step 120). Next, at step 125 (FIG. 8) the ends 12–15 of the elements 10, 11 are smoothed or polished. Referring to FIG. 6, a lapping machine 40 may be used to precisely smooth or lap first the ends 12 and 15 and then the ends 13 and 14 so that each of the elements 10, 11 are linearly aligned with one another and to provide smooth surfaces for electrical connectivity. The lapping process may also be used to create a precise height size of the elements 10, 11 such that the ends 12, 15 and the ends 13, 14 are respectively within the same planes. The encapsulating material 30 provides lateral restraint during the lapping process so that the positively-doped and negatively-doped elements 10, 11 do not become misaligned. The elements 10, 11 could be damaged by the lapping machine 40 if they were misaligned.

The presence of the material 30 provides an anchoring mechanism for the elements 10, 11 during the lapping or polishing process. This anchoring mechanism inhibits shearing and/or fracturing of the elements 10, 11 during the finishing process. Further, the material 30 assists in maintaining accurate alignment of the elements 10, 11.

After lapping of the ends 12–15, the elements 10, 11 are electrically coupled together and attached to a panels 52, 54. Solder balls 51 may be provided to the desired electrical connections. The assembly is coupled to a heat sink 56 at step 130 (FIG. 8) to create a thermoelectric cooler device 50 (FIG. 7). If desired, a semiconductor device (such as a laser device) 58 is thermally coupled to one of the panels 52, 54 to create a semiconductor device 60.

While the invention has been described in detail in connection with the preferred embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Accordingly, the invention is not to be seen as limited by the foregoing description, but is only limited by the scope of the appended claims.

What is claimed as new and desired to be protected by Letters Patent of the United States is:

1. A method for fabricating a semiconductor device, comprising:

positioning first elements on a first support structure and second elements on a second support structure, wherein said positioning comprises:

locating said first elements within a first holding structure;

locating said second elements within a second holding structure;

moving said first holding structure until said first elements contact said first support structure; and removing said holding structures from said support structures;

intermeshing said first and second elements such that each said element contacts each said support structure; and subsequently encapsulating said elements within an encapsulating material.

2. The method of claim 1, further comprising:

releasing at least one of said support structures;

smoothing the ends of said elements; and thermally connecting said elements to a heat sink.

3. The method of claim 2, wherein said encapsulating precedes said releasing.

4. The method of claim 2, wherein one of said support structures is released prior to said encapsulating and the other of said support structures is released subsequent to said encapsulating.

5. The method of claim 1, wherein said intermeshing comprises moving one of said support structures in a direction toward the other said support structure until said elements are adhered to both said support structures.

6. A method for fabricating a semiconductor device, comprising:

locating a plurality of first elements within a first holding structure;

positioning said plurality of first elements on a first support structure;

locating a plurality of second elements within a second holding structure;

positioning said plurality of second elements on a second support structure;

removing said first and second holding structures;

intermeshing said pluralities of first and second elements such that each element contacts each of said first and second support structures; and subsequently encapsulating said elements within an encapsulating material.

7. The method of claim 6, wherein said locating steps comprise:

locating said plurality of first elements on an adhesive surface of a first adhesive material affixed to a first hoop frame; and locating said plurality of second elements on an adhesive surface of a second adhesive material affixed to a second hoop frame.

8. The method of claim 7, wherein said positioning steps comprise:

placing said first holding structure in contact with said adhesive surface of said first adhesive material prior to locating said first elements on said adhesive surface of said first adhesive material;

placing said second holding structure in contact with said adhesive surface of said second adhesive material prior to locating said second elements on said adhesive surface of said second adhesive material; and removing said first and second holding structures from respectively said first and second adhesive materials.

9. The method of claim 7, wherein said positioning steps comprise:

placing said first elements in said first holding structure prior to locating said first elements on said adhesive surface of said first adhesive material;

placing said second elements in said second holding structure prior to locating said second elements on said adhesive surface of said second adhesive material; and removing said first and second holding structures from respectively said first and second elements.

10. The method of claim 7, further comprising releasing at least one of said first and second adhesive materials from said first and second elements.

11. The method of claim 10, wherein said at least one of said first and second adhesive materials being released comprises a temperature sensitive adhesive material, said releasing comprising heating said at least one of said first and second adhesive materials being released.

* * * * *